ABSTRACT

United States Patent [19]

Feldstein

[11] 3,877,810

[45] Apr. 15, 1975

[54] METHOD FOR MAKING A PHOTOMASK

[75] Inventor: Nathan Feldstein, Kendall Park, N.J.

[73] Assignee: RCA Corporation, Princeton, N.J.

[22] Filed: Nov. 8, 1972

[21] Appl. No.: 304,594

[52] U.S. Cl. .................. 355/133; 96/38.3; 355/125; 355/132

[51] Int. Cl. .......................... G03b 27/02; G03c 5/00

[58] Field of Search ............ 95/1 R; 355/3, 17, 125, 355/132, 133; 96/38.4, 41, 44, 38.3

[56] References Cited

UNITED STATES PATENTS

| | | | |
|---|---|---|---|
| 3,202,054 | 8/1965 | Mochel | 117/211 X |
| 3,443,915 | 5/1969 | Wood et al. | 96/38.3 UX |

OTHER PUBLICATIONS

Bajorek et al., "Making Iron Oxide Masks," IBM Technical Disclosure Bulletin, Oct. 1972, Vol. 15, No. 5, pp. 1595–1596.

*Primary Examiner*—Fred L. Braun
*Attorney, Agent, or Firm*—Glenn H. Bruestle; William S. Hill

[57] ABSTRACT

A photomask which comprises a transparent, smooth glass plate and a pattern of opaque, light-absorbing areas of oxides of cobalt on a surface of the plate is obtained by sequentially coating the glass plate with layers of cobalt and a photoresist, exposing the photoresist, developing the photoresist to expose areas of cobalt, etching away the exposed areas of cobalt, and heating the remaining areas of cobalt in the presence of oxgen to convert the same to cobalt oxides.

2 Claims, 7 Drawing Figures

PATENTED APR 15 1975 3,877,810

METHOD FOR MAKING A PHOTOMASK

BACKGROUND OF THE INVENTION

In processes of forming a sheet-like pattern of an etchable material, such as making a metal screen which has a multitude of very accurately spaced and dimensioned openings, a sheet of the etchable material is coated with a photoresist layer. The photoresist layer is then flood-exposed by projecting light through a suitable photomask and the exposed photoresist is developed to produce a pattern of resist and openings corresponding to the final pattern desired. The sheet of etchable material, now coated with the resist pattern, is treated with a solution which is capable of etching the etchable material but not the resist, so as to produce the patterned product. Finally, the remaining resist is removed from the product.

The photomask is an important tool in the making of the patterned etchable article. Previously, photomasks have usually been either one of two distinct varieties. One of these consists of a layer of a photographic emulsion on a transparent substrate which may be either a glass plate or a sheet of synthetic resin. The photographic emulsion is developed to produce the pattern of opaque and transparent areas desired. Such emulsions are soft and easily scratched. The other type comprises a pattern of chromium deposited on a transparent glass substrate. The chromium may be deposited either by vacuum evaporation or by sputtering of a uniform film with subsequent etching to remove the unwanted portions. Such metal films are scratch resistant but the equipment for either vacuum deposition or sputtering is expensive, especially for deposition on large area substrates.

In order to obtain high resolution and good image reproduction in the final pattern, the surface of the photomask is usually pressed firmly against the photosensitive resist coating in the process of making an exposure. The surface of the photoresist coating is normally not smooth and the surface of the photomask is subject to considerable abrasion as well as to deformation due to pressure on the pattern taking place during contact printing. If the photomask is of the photographic emulsion variety, its surface becomes scratched and damaged by the contact, especially where the photomask is being used in making a large number of successive copies. The scratched photomask must either be repaired, or, if the damage is too extensive, it must be discarded. Keeping scratched photomasks in repair is a relatively expensive process requiring tediuous hand labor.

Chromium type photomasks are not as subject to scratch damage as the photographic emulsion type is, but the chromium photomask has other disadvantages. If the area of the photomask is relatively large, for example a couple of square feet, it is extremely difficult to obtain a chromium layer of uniform thickness by vacuum evaporation or sputtering techniques. Consequently, some parts of the photomask may be too thin to wear well or the pattern can be inadequately defined in the chromium layer. There is also a problem of adhesion. As the layer of chromium is made thicker to resist wear and to eliminate the possibility of pin holes, the surface of the coating becomes softer and easier to remove by abrasion. Also, the thicker coatings do not adhere as well to the glass substrate.

Most large-screen color television picture tubes include a so-called shadowmask comprising a thin sheet of metal provided with several hundred thousand accurately spaced and dimensioned holes to aid in guiding streams of electrons which are to impinge on phosphor dots on the viewing screen. Large size picture tubes have viewing screen diagonals of 23 inches and even greater. The shadowmask has an area correspondingly large. Consequently, in manufacturing the shadowmasks by an etching process, large area photomasks are employed. It has been found that emulsion type photomasks wear out rapidly in this process and the cost of their maintenance is relatively high. It is highly desirable that an improved photomask be used which requires less maintenance because it has a sufficiently hard surface and which is sufficiently uniform to meet the requirements of mass production.

A photomask which has the required abrasion resistance and uniformity can be made by electrolessly depositing a pattern of nickel on a cleaned glass substrate. A process of making this type of mask is described in U.S. Pat. No. 3,669,770 issued June 13, 1972 to Nathan Feldstein. Although masks so produced have proved satisfactory in commercial shadowmask production, both chromium masks and nickel masks have a disadvantage which lowers their ability to resolve very fine lines and other minute shapes especially when the mask is used to delineate a metallic film. Both nickel and chromium deposits reflect light very well. Consequently, when light is passed through the openings in a mask of these metals to the surface of a body which is to be etched, some of the light which passes through the openings at an angle to the normal is diffracted to the part of the surface being etched which is beneath opaque areas of the mask and some of the light is reflected back to the undersurface of the mask and then may undergo multiple reflections. The result of this is to reduce the resolution capabilities of the photomask and also to produce poor line definition.

SUMMARY OF INVENTION

The present invention is an improved photomask of the type wherein a combination of metallic oxides is the masking material. The mask comprises a pattern of opaque, light-absorbing areas of cobalt oxides on a transparent glass substrate or on a conductive coating on the glass, which has good ultraviolet light transmission properties. It has been found that cobalt has good adherence to glass or to the conductive coatings and that cobalt oxides have in addition to good adhesive properties, good abrasion resistance and low light-reflectance characteristics.

THE DRAWING

DESCRIPTION OF PREFERRED EMBODIMENTS

Figure 1:
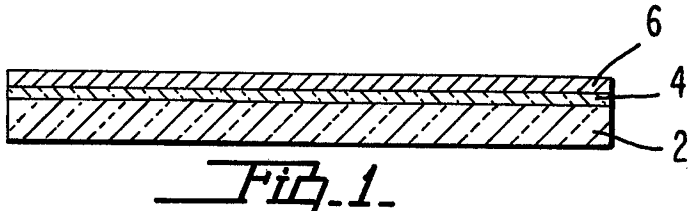
FIGS. 1–5 are similar cross-section views of one embodiment of a photomask in successive intermediate steps of production in accordance with the present invention.

One step in a process of making a photomask of the present invention is to thoroughly clean one surface of a glass plate which is to be metallized. First, however, a glass plate 2, as shown in FIG. 1, may be given a transparent conductive coating 4 by any conventional process such as that which forms a layer of stannic oxide (also, more commonly called "tic"). Other transparent conductive coatings may be $In_2O_3$ doped with $SnO_2$ as described in "RF Sputtered Transparent Conductors II: The System $In_2O_3$–$SnO_2$" by John L. Vossen; RCA Review, June 1971, Vol. 32, No. 2, pp. 289–296; or $SnO_2$ doped with $Sb_2O_3$ as described in a paper presented by John L. Vossen at the Third Symposium on the Deposition of Thin Films by Sputtering; Rochester, N.Y. Sept., 1969.

Any conductive coating may be used which has fairly good transmission properties for ultraviolet light and sufficiently good adhesion for cobalt and cobalt oxides. Cleaning of the coated surface may be accomplished using any one of several well known detergents, such as Sparkleen. After cleaning, the surface is thoroughly rinsed in deionized water. A further cleaning step may be used which comprises immersing the surface in a warm solution of sulfuric acid and potassium dichromate for about 5 minutes. The cleaned surface is again thoroughly rinsed.

Next the cleaned surface is sensitized using a solution of stannous chloride acidified with hydrochloric acid. The sensitizing solution may be made by first making a concentrate consisting of 214 grams $SnCl_2 . 2H_2O$ and 290 cc. Conc. HCl. The actual sensitizing solution which is used in the process comprises 50 cc. of the concentrate diluted to 1 liter with water. A dip of the cleaned glass plate in the sensitizing solution for one or two minutes is sufficient. After the sensitization step, the plate is rinsed thoroughly with warm water.

The sensitized surface is next activated with a solution of palladium chloride. The activating solution consists of 1 gram per liter of palladium chloride and 1 cc. per liter of concentrated hydrochloric acid. the remainder of the solution is water. The plate is again rinsed with water after treatment with the activating solution for a brief period.

A layer of cobalt 6 can then be deposited by an elecroless deposition technique on the transparent conducting coating 4. This can be done, for example, by dipping the entire plate in a bath having the following composition:

| | |
|---|---|
| $CoCl_2.6H_2O$ | 7.5 g/l |
| $NaH_2PO_2.H_2O$ | 7.0 g/l |
| $NH_4OH$ to pH 8.2 | |
| Citric acid | 19.8 g/l |
| $NH_4Cl$ | 12.5 g/l |

The temperature of the bath is maintained at about 80° C and plating is continued until an opaque coating is obtained. A suitable coating thickness is about 1200 Angstroms.

Figure 2:
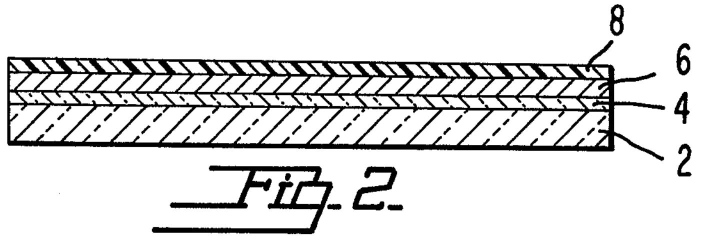
Figure 3:
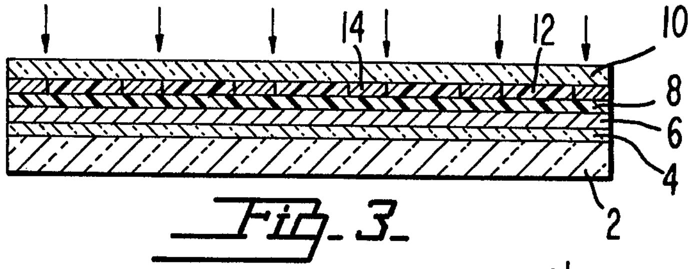

The next step is to deposit a coating 8 (FIG. 2) of a conventional negative type photoresist on top of the cobalt layer 6. Then this layer of photoresist 8 is exposed through a master (FIG. 3) composed of a glass substrate 10 having on one surface a layer of a photoemulsion 12 having a pattern of darkened silver areas 14 which correspond to areas which eventually will be clear in the finished metal photomask.

Figure 4:
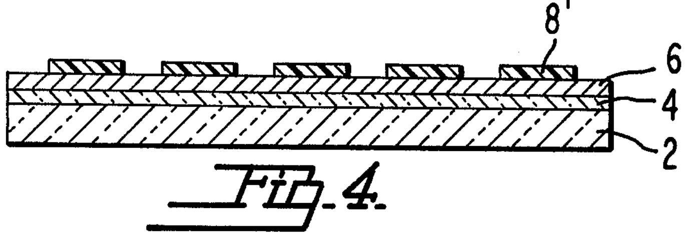

After exposure through the rear surface of the glass substrate 10, the photoresist layer 8 is developed, leaving hardened areas of photoresist 8' (FIG. 4).

Figure 5:
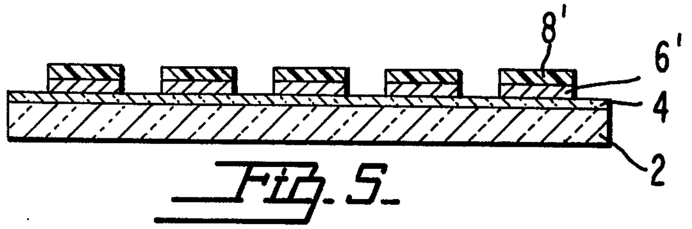
Figure 6:
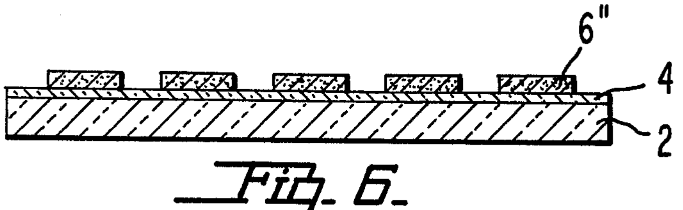
FIG. 6 is a similar view of a completed photomask.

The assembly may then be immersed in a bath containing 10% by wt. of ammonium oxalate, in aqueous solution, and also (optionally) 10% by wt. of concentrated ammonium hydroxide. With the assembly connected as cathode and a platinum anode, the cobalt coating 6 is electrochemically etched at 10 volts until all of the cobalt is removed in areas not covered by the hardened photoresist areas 8' (FIG. 5). This leaves a pattern of cobalt areas 6' beneath the photoresist areas 8'. Alternatively, a chemical etching may be carried out using 20% hydrochloric acid or other etchant.

Next, the hardened photoresist areas 8' are removed and the areas of cobalt 6' are heated to a temperature of 200°–450° C in moist oxygen-containing atmosphere until they are converted into brown-black areas 6'', composed of cobalt oxides, which are substantially non-reflecting to ultraviolet light. These areas 6'' are abrasion-resistant and are also resistant to even strong solvents. A mask made of such areas shows a decreased tendency for multiple reflections and thus permits sharp definition of the layer being etched.

Figure 7:
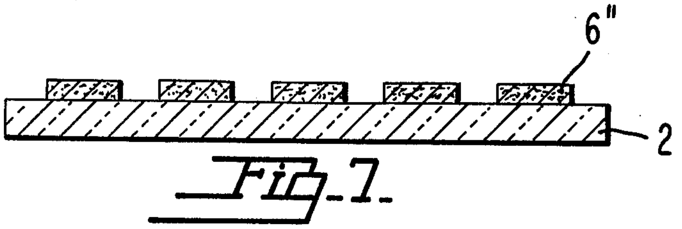
FIG. 7 is a cross-section view of another embodiment of a photomask of the invention.

In another embodiment of the method of the invention, the transparent conductive coating 4 is omitted and the cobalt layer 6 is deposited directly on the glass substrate 2. First, the glass substrate is cleaned, sensitized and activated as in the previous example. Then the cobalt layer 6 is deposited using the same bath as set forth in the example. Finally, after the cobalt layer 6 is covered with the photoresist layer 8 and the photoresist layer 8 is exposed through the master, and developed, the cobalt layer is chemically etched as with 20% hydrochloric acid and then heat treated. Other chemical etchants may also be used. The completed photomask (FIG. 7) comprises the glass substrate 2 and areas 6'' of cobalt oxides adhering thereto.

I claim:

1. A method of making a photomask having a pattern of darkened areas comprising the steps of:

depositing a layer of cobalt on a glass surface, covering said cobalt layer with a layer of photoresist, exposing said layer of photoresist to provide a pattern of hardened areas corresponding to the darkened areas in the final mask, and unhardened areas corresponding to clear areas in the final mask, developing said photoresist thereby removing the unhardened areas of said photoresist to expose areas of said cobalt, etching away said exposed areas of cobalt leaving a pattern of cobalt areas on said glass surface covered with hardened photoresist, removing said hardened areas of photoresist over said pattern of cobalt areas, and heating said pattern of cobalt areas to a temperature of 200°–450° C in the presence of oxygen and moisture to convert said cobalt areas into cobalt oxides which are light-absorbine and have a brown-black color.

2. A method according to claim 1 including the step of depositing a layer of a substance which is electrically conductive and is capable of transmitting ultraviolet light on said glass surface prior to the step of depositing said cobalt.

* * * * *